United States Patent
Chen

(10) Patent No.: US 11,899,072 B2
(45) Date of Patent: Feb. 13, 2024

(54) METHOD FOR ESTIMATING DEPTH OF DISCHARGE OF BATTERY

(71) Applicant: Yu Min Chen, Kaohsiung (TW)

(72) Inventor: Yu Min Chen, Kaohsiung (TW)

(73) Assignee: Joules Miles Co., Ltd., Kaohsiung (TW)

( * ) Notice: Subject to any disclaimer, the term of this patent is extended or adjusted under 35 U.S.C. 154(b) by 444 days.

(21) Appl. No.: 17/389,390

(22) Filed: Jul. 30, 2021

(65) Prior Publication Data

US 2021/0356526 A1   Nov. 18, 2021

(51) Int. Cl.
*G01R 31/3842* (2019.01)
*G01R 19/165* (2006.01)

(52) U.S. Cl.
CPC ... *G01R 31/3842* (2019.01); *G01R 19/16542* (2013.01)

(58) Field of Classification Search
CPC .............. G01R 31/386; G01R 31/388; G01R 31/3842; G01R 19/16542; G01R 31/367; H02J 7/0069; H02J 7/007
USPC ........................................................ 320/134
See application file for complete search history.

(56) References Cited

U.S. PATENT DOCUMENTS

2013/0038292 A1 *  2/2013  Barrett ................. G01R 31/367
                                                              320/134

\* cited by examiner

*Primary Examiner* — Paul Dinh

(57) ABSTRACT

A method for estimating DoD of a battery includes obtaining voltage Va at a first electric charge rate A(Ia) and voltage Vb at a second electric charge rate B(Ib) by checking a voltage-DoD table based on DoD of an experimental battery respectively; measuring voltage V of the experimental battery; substituting Ia, Ib, Va, Vb and V into an expression to calculate an estimated current Iest; and using a Coulomb counter to update the voltage-DoD table and estimate the DoD of the experimental battery.

2 Claims, 2 Drawing Sheets

METHOD FOR ESTIMATING DEPTH OF DISCHARGE OF BATTERY

BACKGROUND OF THE INVENTION

1. Field of the Invention

The invention relates to battery management and more particularly to a method for estimating Depth of Discharge (DoD) of a battery for an efficient operation of the battery.

2. Description of Related Art

A battery management system (BMS) may estimate a state of a battery, for example, a State of Charge (SoC) and a Depth of Discharge (DoD), for an efficient operation of the battery. Available uses for a battery may be expanded based on accuracy in estimating SoC and DoD of the battery, and thus the BMS may need to accurately estimate a state of the battery.

Conventionally, a method for estimating DoD of a battery involves using a Coulomb counter (also called ampere hour (A h)) to estimate the remaining capacity of the battery. It is known that a battery may consume over time and use. Thus, the capacity of the battery estimated by the Coulomb counter may be incorrect. The Coulomb counter may involve continuous addition or subtraction operations. Thus, a small data error may make the estimated capacity of the battery to be erroneous. Thus, the need of improving precision of the Coulomb counter still exists.

SUMMARY OF THE INVENTION

It is therefore one object of the invention to provide a quick method for precisely estimating the Depth of Discharge of a battery.

To achieve above and other objects of the invention, the invention provides a method for estimating Depth of Discharge (DoD) of a battery, comprising the steps of obtaining voltage Va at a first electric charge rate A(Ia) and voltage Vb at a second electric charge rate B(Ib) by checking a voltage-DoD table based on DoD of an experimental battery respectively; measuring voltage V of the experimental battery; substituting Ia, Ib, Va, Vb and V into an expression $$I_{est} = (I_b - I_a) \times \frac{(V_a - V)}{(V_a - V_b)}$$

to calculate an estimated current Iest; and using a Coulomb counter to update the voltage-DoD table and estimate the DoD of the experimental battery.

The above and other objects, features and advantages of the invention will become apparent from the following detailed description taken with the accompanying drawings.

DETAILED DESCRIPTION OF THE INVENTION

Figure 1:
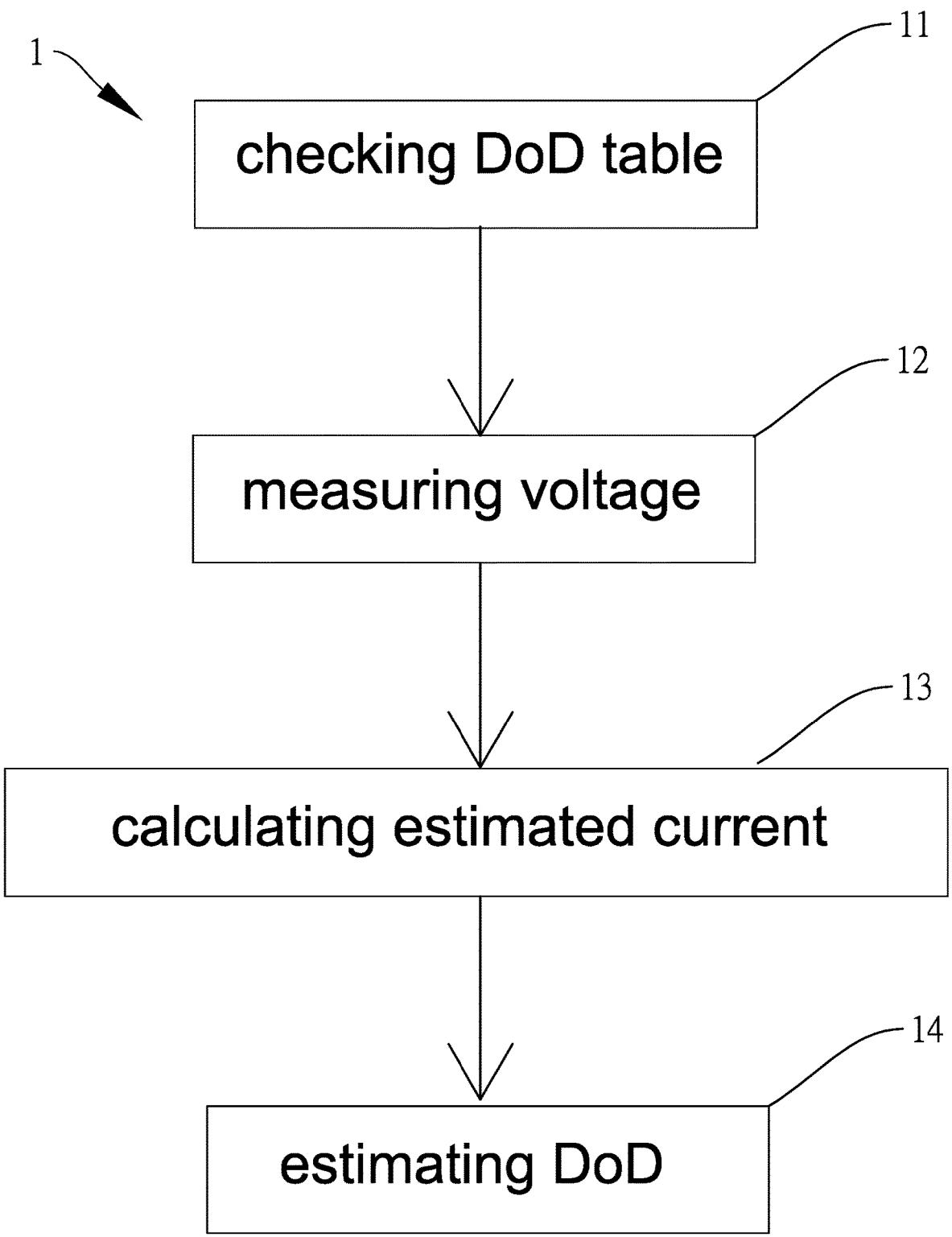
FIG. 1 is a flow chart illustrating a method for estimating DoD of a battery according to the invention.
Figure 2:
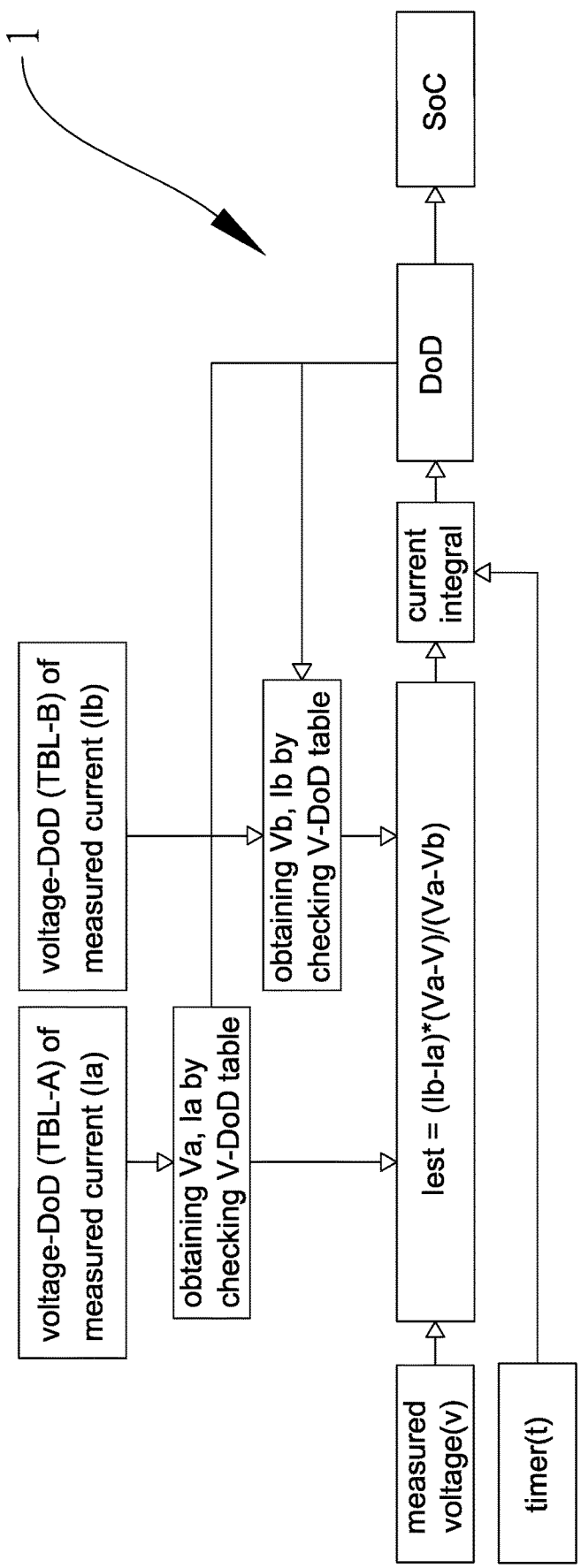
FIG. 2 is a block diagram for schematically depicting the estimation of the DoD of the battery.

Referring to FIGS. 1 to 2, a method 1 for estimating Depth of Discharge (DoD) of a battery in accordance with the invention comprises the following steps:

11 of obtaining voltage Va at a first electric charge rate A(Ia) and voltage Vb at a second electric charge rate B(Ib) by checking a voltage-DoD table based on DoD of an experimental battery respectively;

12 of using a voltmeter to measure voltage (V) of the experimental battery;

13 of substituting Ia, Ib, Va, Vb and V into an expression $$I_{est} = (I_b - I_a) \times \frac{(V_a - V)}{(V_a - V_b)}$$

to calculate an estimated current Iest; and 14 of using a Coulomb counter to update the voltage-DoD table and estimate the DoD of the battery.

It is envisaged by the invention that it is possible of estimating DoD of a battery by checking a voltage-DoD table to obtain voltages and measuring voltage of a battery to calculate an estimated current. Thus, error in the current estimation is decreased to a minimum when the Coulomb counter is used.

While the invention has been described in terms of preferred embodiments, those skilled in the art will recognize that the invention can be practiced with modifications within the spirit and scope of the appended claims.

What is claimed is:

1. A method for estimating Depth of Discharge (DoD) of a battery, comprising the steps of:

(1) obtaining voltage Va at a first electric charge rate A(Ia) and voltage Vb at a second electric charge rate B(Ib) by checking a voltage-DoD table based on DoD of an experimental battery respectively;

(2) measuring voltage V of the experimental battery;

(3) substituting Ia, Ib, Va, Vb and V into an expression $$I_{est} = (I_b - I_a) \times \frac{(V_a - V)}{(V_a - V_b)}$$

to calculate an estimated current Iest; and (4) using a Coulomb counter to update the voltage-DoD table and estimate the DoD of the experimental battery.

2. The method for estimating Depth of Discharge (DoD) of a battery of claim 1, wherein in step (2) the measurement is done by using a voltmeter.

* * * * *